(12) United States Patent
Chandra et al.

(10) Patent No.: US 7,553,430 B2
(45) Date of Patent: Jun. 30, 2009

(54) POLISHING SLURRIES AND METHODS FOR CHEMICAL MECHANICAL POLISHING

(75) Inventors: Sunil Chandra, Oro Valley, AZ (US); Sreehari Nimmala, Oro Valley, AZ (US); Suryadevara Vijayakumar Babu, Potsdam, NY (US); Udaya B. Patri, Potsdam, NY (US); Sharath Hedge, Potsdam, NY (US); Youngki Hong, Potsdam, NY (US)

(73) Assignee: Climax Engineered Materials, LLC, Phoenix, AZ (US)

( * ) Notice: Subject to any disclaimer, the term of this patent is extended or adjusted under 35 U.S.C. 154(b) by 0 days.

(21) Appl. No.: 11/540,297

(22) Filed: Sep. 29, 2006

(65) Prior Publication Data

US 2007/0023731 A1    Feb. 1, 2007

Related U.S. Application Data

(60) Division of application No. 11/032,717, filed on Jan. 11, 2005, now Pat. No. 7,186,653, which is a continuation-in-part of application No. 10/846,718, filed on May 13, 2004, which is a continuation-in-part of application No. 10/631,698, filed on Jul. 30, 2003.

(51) Int. Cl.
C09K 13/00 (2006.01)

(52) U.S. Cl. .................. 252/79.1; 252/79.2; 252/79.3; 252/79.4; 252/62; 216/41; 216/57; 216/88; 438/691; 438/692; 438/687

(58) Field of Classification Search ............... 252/79.1, 252/79.2, 79.3, 79.4; 438/692
See application file for complete search history.

(56) References Cited

U.S. PATENT DOCUMENTS

| | | | |
|---|---|---|---|
| 5,244,534 A | 9/1993 | Yu et al. | |
| 5,318,927 A | 6/1994 | Sandhu et al. | |
| 5,728,308 A | 3/1998 | Muroyama | |
| 5,735,963 A | 4/1998 | Obeng | |
| 5,770,103 A | 6/1998 | Wang et al. | |
| 5,786,275 A | 7/1998 | Kubo | |
| 5,836,806 A | 11/1998 | Cadien et al. | |
| 5,954,975 A | 9/1999 | Cadien et al. | |
| 5,958,288 A | 9/1999 | Mueller et al. | |
| 5,981,378 A * | 11/1999 | Bothra ........................ 438/637 |
| 5,993,686 A | 11/1999 | Streinz et al. | |
| 5,996,594 A | 12/1999 | Roy et al. | |
| 6,017,463 A | 1/2000 | Woo et al. | |
| 6,027,997 A | 2/2000 | Yu et al. | |
| 6,046,099 A | 4/2000 | Cadien et al. | |
| 6,093,649 A | 7/2000 | Roberts et al. | |
| 6,117,220 A | 9/2000 | Kodama et al. | |
| 6,143,656 A | 11/2000 | Yang et al. | |
| 6,178,585 B1 | 1/2001 | Cadien et al. | |
| 6,270,395 B1 | 8/2001 | Towery et al. | |
| 6,284,151 B1 | 9/2001 | Krywanczyk et al. | |
| 6,294,105 B1 | 9/2001 | Feeney et al. | |
| 6,348,076 B1 | 2/2002 | Canaperi et al. | |
| 6,358,853 B2 | 3/2002 | Cadien et al. | |
| 6,362,104 B1 | 3/2002 | Wang et al. | |
| 6,364,744 B1 | 4/2002 | Merchant et al. | |
| 6,375,545 B1 | 4/2002 | Yano et al. | |
| 6,375,552 B1 | 4/2002 | Cadien et al. | |
| 6,419,554 B2 * | 7/2002 | Chopra et al. .................. 451/41 |
| 6,448,182 B1 | 9/2002 | Hall et al. | |
| 6,454,819 B1 * | 9/2002 | Yano et al. ..................... 51/298 |
| 6,511,912 B1 | 1/2003 | Chopra et al. | |
| 6,520,840 B1 | 2/2003 | Wang et al. | |
| 6,530,968 B2 | 3/2003 | Tsuchiya et al. | |
| 6,544,892 B2 | 4/2003 | Her et al. | |
| 6,548,409 B1 | 4/2003 | Lee et al. | |
| 6,551,172 B1 | 4/2003 | Nyui et al. | |
| 6,551,935 B1 | 4/2003 | Sinha et al. | |
| 6,558,570 B2 | 5/2003 | Alwan et al. | |
| 6,561,883 B1 | 5/2003 | Kondo et al. | |
| 6,569,350 B2 | 5/2003 | Kaufman et al. | |
| 6,585,568 B2 | 7/2003 | Tsuchiya et al. | |

(Continued)

FOREIGN PATENT DOCUMENTS

EP    0811665 A2    12/1997

(Continued)

OTHER PUBLICATIONS

Tabata et al., Method of Polishing Semiconductor Base Board, Englsih Abstract of JP 59187457 A, Nov. 10, 1984, 2 pages.*

(Continued)

*Primary Examiner*—Nadine G Norton
*Assistant Examiner*—Mahmoud Dahimene
(74) *Attorney, Agent, or Firm*—Fennemore Craig, P.C.

(57) ABSTRACT

Aqueous polishing slurries for chemical-mechanical polishing are effective for polishing copper at high polish rates. The aqueous slurries according to the present invention may include soluble salts of molybdenum dissolved in an oxidizing agent and molybdic acid dissolved in an oxidizing agent. Methods for polishing copper by chemical-mechanical planarization include polishing copper with low pressures using a polishing pad and a aqueous slurries including soluble salts of molybdenum dissolved in an oxidizing agent and molybdic acid dissolved in an oxidizing agent, particles of $MoO_3$ dissolved in an oxidizing agent, and particles of $MoO_2$ dissolved in an oxidizing agent.

12 Claims, No Drawings

U.S. PATENT DOCUMENTS

| | | | |
|---|---|---|---|
| 6,585,786 | B2 | 7/2003 | Tsuchiya et al. |
| 6,589,099 | B2 | 7/2003 | Haggart, Jr. et al. |
| 6,610,114 | B2 | 8/2003 | Towery et al. |
| 6,660,638 | B1 | 12/2003 | Wang et al. |
| 6,723,143 | B2 | 4/2004 | Towery et al. |
| 6,726,535 | B2 | 4/2004 | Shih et al. |
| 6,726,990 | B1 | 4/2004 | Kumar et al. |
| 6,758,872 | B2 | 7/2004 | Ota et al. |
| 6,805,615 | B1 | 10/2004 | Robinson et al. |
| 6,863,592 | B2 | 3/2005 | Lee et al. |
| 6,924,227 | B2 | 8/2005 | Minamihaba et al. |
| 2001/0013506 | A1 | 8/2001 | Chamberlin et al. |
| 2001/0034979 | A1 | 11/2001 | Lee et al. |
| 2001/0045063 | A1 | 11/2001 | Kambe et al. |
| 2002/0051878 | A1 | 5/2002 | Lussier et al. |
| 2002/0098701 | A1 | 7/2002 | Hasegawa |
| 2003/0079416 | A1 | 5/2003 | Ma et al. |
| 2003/0087525 | A1* | 5/2003 | Sinha et al. ............ 438/691 |
| 2003/0166381 | A1 | 9/2003 | Lee et al. |
| 2003/0194879 | A1 | 10/2003 | Small et al. |
| 2003/0211747 | A1 | 11/2003 | Hegde et al. |
| 2003/0226998 | A1 | 12/2003 | Grumbine |
| 2004/0046148 | A1* | 3/2004 | Zhang et al. ............ 252/79.4 |
| 2004/0244911 | A1 | 12/2004 | Lee et al. |

FOREIGN PATENT DOCUMENTS

| | | |
|---|---|---|
| EP | 0846742 A1 | 6/1998 |
| EP | 1069168 A1 | 1/2001 |
| EP | 1020488 A3 | 5/2001 |
| EP | 1167482 A2 | 1/2002 |
| EP | 1020501 A3 | 1/2004 |
| EP | 1234010 B1 | 3/2004 |
| JP | 59187457 A * | 10/1984 |
| JP | 200475859 | 3/2004 |
| WO | 9747030 A1 | 12/1997 |
| WO | 0049647 A1 | 8/2000 |
| WO | 01/32799 A1 | 5/2001 |
| WO | 03015148 A1 | 2/2003 |

OTHER PUBLICATIONS

Ammonium Molybdate MSDS, Flinn Scientific Inc., (Nov. 25, 2002) (2 pages).*

Phosphomolybic Acid MSDS, EMS, (Jan. 25, 2002) (5 pages).*

Material Safety Data Sheet for Sodium Molybdate ((2002) (pp. 1-3)).*

Aramaki, et al., "Surface Enhanced Raman Scattering and Impedance Studies on the Inhibition of Copper Corrosion in Sulphate Solutions by 5-Substituted Benzotriazoles", Corrosion Science, vol. 32, No. 5/6, 1991, pp. 593-607.

Aveston, et al., "Hydrolysis of Molybdenum(VI). Ultracentrifugation, Acidity Measurements, and Raman Spectra of Polymolybdates", Hydrolysis of Molybdenum (VI), vol. 3, No. 5, 1964, pp. 735-746.

Bhuvanesh et al., "Solid-state chemistry of early transition-metal oxides containing Do and D1 cations" J. Mater. Chem., 1997, 7, pp. 2297-2306.

Busey, et al., Structure of the Aqueous Pertechnetate Ion by Rama and Infrared Spectroscopy. Raman and Infrared Spectra of Crystalline KTcO4, KReO4, Na2MoO4, Na2WO4, Na2MoO4, 2H2O, and Na2WO4, 5H2O, J. of Chem. Physics, vol. 41, No. 1, 1964, pp. 215-225.

Du, et al., "Electrochemical characterization of copper chemical mechanical planarization in KIO3 slurry", Applied Surface Sicence 229, 2004, pp. 167-174.

Gutmann, et al., "Chemical-mechanical polishing of copper with oxide and polymer interlevel dielectrics", Thin Solid Films 270, 1995, pp. 596-600.

Hariharaputhiran, et al., "Chemical Mechanical Polishing of Ta", Electrochemical and Solid-State Letters, 3, 2000, pp. 95-98.

Hegde et al., "Removal of Shallow and Deep Scratches and Pits from Polished Copper Films", Electrochemical and Solid-State Letters, 6, 2003, pp. G126-G129.

Jindal, et al., "Chemical Mechanical Polishing of Dielectric Films Using Mixed Abrasive Slurries", J. of the Electrochemical Society, 150, 2003, pp. G314-G318.

Jindal, et al., "Chemical Mechanical Polishing Using Mixed Abrasive Slurries", Electrochemical and Solid-State Letters, 5, 2002, pp. G48-G50.

Kallay, et al., "Adsorption at Solid/Solution Interfaces. 1. Interpretation of Surface Complexation of Oxalic and Citric Acids with Hematite", Langmuir vol. 1, No. 2 , American Chemical Society, 1985, pp. 195-201.

Kamigata, et al., "Why abrasive free Cu slurry is promising" Mat. Res. Soc. Symp. Proc. vol. 671, 2001, Materials Research Society, pp. M1.3.1-M1.3.12.

Kaufman, et al., "Chemical-Mechanical Polishing for Fabricating Patterned W Metal Features as Chip Interconnects", J.Electrochem. Soc. vol. 138, No. 11, Nov. 1991, pp. 3460-3465.

Keita, et al., "New Aspects of the Electrochemistry of Heteropolyacids, Part II. Coupled Electron and Proton Transfers in the Reduction of Silicotungstic Species", J. Electroanal. Chem., 217, 1987, pp. 287-304.

Kondo, et al., "Abrasive-Free Polishing for Copper Damascene Interconnection", J. of the electrochemical Society. 147, 2000, pp. 3907-3913.

Lakshminarayanan, et al., "Contact and Via Structures with Copper Interconnects Fabricated Using Dual Damascene Technology", IEEE Electron Device Letters, vol. 15, No. 8, Aug. 1994, pp. 307-309.

Li, et al., "Chemical Mechanical Polishing of Copper and Tantalum in Potassium Iodate-Based Slurries", Electrochemical and Solid-State Letters, 4, 2001, pp. G20-G22.

Y. Li, Mechanisms of Chemical-Mechanical Planarization of Copper/Tantalum Thin Films Using Fumed Silica Abrasives, Surface Topography, Ph.D. Dessertation, Clarkson University, Jan. 2001, pp. 123-126.

Liu, et al., "Preparation of Nano-sized Amorphous Molybdenum Dioxide Powders by Use of y-Ray Radiation Method", Materials Research Bulletin, vol. 31, No. 8, 1996, pp. 1029-1033.

Luo, "Copper Dissolution Behavior in Acidic Iodate Solutions", Langmuir, vol. 16, No. 11, 2000, pp. 5154-5158.

Luo, et al., "Dishing Effects during Chemical Mechanical Polishing of Copper in Acidic Media", Journal of the Electrochemical Society, vol. 147, 2000, pp. 4639-4644.

Matsuda et al., "Characteristics of Abrasive-Free Micelle Slurry for Copper CMP", J. of the Electrochemical Society, 150, 2003, pp. G532-G536.

Neirynck, et al., "The addition of surfactant to slurry for polymer CMP: effects on polymer surface, removal rate and underfying Cu", Thin Solid Films, 1996, pp. 447-452.

Rothschild, et al., "Study of the interaction at rest potential between silicotungstic heteropolyanion solution and GaAs surface", Applied Surface Science 135, 1998, pp. 65-70.

Ryan, et al., "On-chip interconnection technology", The evolution of interconnection techn IBM, IBM Journal of Research and Development, vol. 39, Nov. 4, 1995, 9 pages.

Savadogo, et al., "The hydrogen evolution reaction in basic medium on iron electrodeposited with heteropolyacids", J. of Applied Electrochemistry 22, 1992, pp. 437-442.

Savadogo, et al., "The hydrogen evolution reaction in an acid medium on nickel electrodeposited with SiW12O4-40 or SiMO12O4-40 from electrolytes of various anionic compositions", J. of Applied Electrochemistry 21, 1991, pp. 73-76.

Savadogo, et al., "The hydrogen evolution reaction in an acid medium on nickel electrodeposited with PMo12O3-40 or MoO2-4", J. of Applied Electrochemistry 21, 1991, pp. 457-462.

Singer, "Tantalum, Copper and Damascene: The Future of Interconnects", www.reed-electronics.com, 1998, 8 pages.

Steigerwald, et al., "Mechanisms of copper removal during chemical mechanical polishing", J. Vac. Sci. Technol. B 13 (6), 1995, American Vacuum Society, pp. 2215-2218.

Tromans, "Aqueous Potential-pH Equilibria in Copper-Benzotriazole Systems", J. Electrochem, Soc., vol. 145, No. 3, Mar. 1998, pp. L42-L45.

Wehrer, et al., "Catalytic reactions of n-hexane and 1-hexene on molybdenum dioxide", Applied Calalysis A: General 243, 2003, pp. 109-119.

Zhang, et al., "Interactions of Metal Hydrous Oxides with Chelating Agents. 7. Hematite-Oxalic Acid and -Citric Acid Systems", Langmuir, vol. 1, No. 2, American Chemical Society, 1985, pp. 201-206.

P. Wrschka, et al., "Chemical Mechanical Planarization of Copper Damascene Structures," pp. 706-712, 2000, The Electrochemical Society, S0013-4651(99)06-096-6.

S.V. Babu, et al., "Polishing Slurry and Method for Chemical-Mechanical Polishing of Copper," U.S. Appl. No. 10/631,698, filed on Jul. 30, 2003, 25 pages of specification.

ABCR GMBH&CO ET AL., Avocado/ABCR Catalogue 2000-2001: Chemicals for Research and Development, 2001, p. 774, XP002337567.

* cited by examiner

POLISHING SLURRIES AND METHODS FOR CHEMICAL MECHANICAL POLISHING

CROSS-REFERENCE TO RELATED APPLICATION

This application is a division of U.S. patent application Ser. No. 11/032,717, filed Jan. 11, 2005, now U.S. Pat. No. 7,186,653, which is a continuation-in-part of co-pending U.S. patent application Ser. No. 10/846,718, filed on May 13, 2004, which is a continuation-in-part of co-pending U.S. patent application Ser. No. 10/631,698, filed on Jul. 30, 2003, which are hereby incorporated by reference for all that they disclose.

TECHNICAL FIELD

This invention relates to chemical-mechanical planarization processes in general and more specifically to slurries and methods for chemical-mechanical planarization.

BACKGROUND

Chemical-mechanical polishing (CMP) is the term used to refer to a process that is used in semiconductor manufacture. As its name implies, the CMP process is typically used in semiconductor processing to polish (e.g., planarize) the surface of the semiconductor wafer. The CMP process is relatively new in that, until recently, conventional processes were sufficient with the comparatively low circuit densities involved. However, increases in circuit densities (e.g., the transition from wafers having 0.25 micron features to 0.18 micron features, and even to 0.045 micron features) have forced the need to develop new processes for planarizing the wafer, of which CMP has become favored. Similarly, the more recent shift away from aluminum interconnect technology to copper interconnect technology has further favored the use of CMP to polish (e.g., planarize) semiconductor wafers.

Briefly, the chemical-mechanical polishing (CMP) process involves scrubbing a semiconductor wafer with a pad in the presence of a chemically reactive slurry that contains abrasive particles. As its name implies, the polishing action of the chemical-mechanical polishing (CMP) process is both chemical and mechanical. Chemicals aid in material removal by modifying the surface film while abrasion between the surface particles, pad, and the modified film facilitates mechanical removal. It is believed that this synergistic interplay between the chemical and mechanical components in the process is the key to effective polishing of the CMP process.

While the CMP process is being increasingly used in semiconductor manufacturing processes, the CMP process remains poorly understood, and the exact mechanisms though which the process works have not been determined. For example, while certain parameters for the CMP process have been developed that are satisfactory for wafers utilizing aluminum interconnect technology, those same process parameters have not proven to be particularly satisfactory for use with wafers utilizing copper interconnect technology. One important requirement of a successful CMP slurry for copper is a high polish rate. High polish rates lead to shorter copper overburden polishing times.

SUMMARY OF THE INVENTION

The following summary is provided as a brief overview of the claimed product and process. It shall not limit the invention in any respect, with a detailed and fully-enabling disclosure being set forth in the Detailed Description of Preferred Embodiments section. Likewise, the invention shall not be restricted to any numerical parameters, processing equipment, chemical reagents, operational conditions, and other variables unless otherwise stated herein.

The claimed invention involves novel aqueous slurries which exhibit high polish rates for copper when used in the CMP process at low pressures. One embodiment of aqueous slurries according to the present invention comprises soluble salts of molybdenum dissolved in deionized water and an oxidizing agent.

Embodiments of aqueous slurries may contain dissolved soluble salts of molybdenum in amounts ranging from about 0.1% to about 10% by weight of the soluble salts of molybdenum and the oxidizing agent may comprise any one or a mixture of hydrogen peroxide ($H_2O_2$), ferric nitrate ($Fe(NO_3)_3$), potassium iodate ($KIO_3$), nitric acid ($HNO_3$), potassium permanganate ($KMnO_4$), potassium persulfate ($K_2S_2O_8$), ammonium persulfate ($(NH_4)_2S_2O_8$), potassium periodate ($KIO_4$), and hydroxylamine ($NH_2OH$). Additionally, complexing agents may be used in the molybdenum trioxide ($MoO_3$) aqueous slurry. Complexing agents may comprise any one or a mixture of glycine ($C_2H_5NO_2$), alanine ($C_3H_7NO_2$), amino butyric acids ($C_4H_9NO_2$) ethylene diamine ($C_2H_8N_2$), ethylene diamine tetra acetic acid (EDTA), ammonia (NH3), family of mono, di, and tri-carboxylic acids like citric acid ($C_6H_8O_7$), phthalic acid ($C_6H_4(COOH)_2$), oxalic acid ($C_2H_2O_4$), acetic acid ($C_2H_4O_2$), succinic acid ($C_4H_6O_4$), and family of amino benzoic acids.

Embodiments of slurries containing the soluble salts of molybdenum may also be provided with a nonionic surfactant, an anionic surfactant, or a cationic surfactant. The anionic surfactant in the aqueous slurry may comprise any one or a mixture of polyacrylic acid (PAA), a carboxylic acid or its salt, a sulfuric ester or its salt, a sulfonic acid or its salt, a phosphoric acid or its salt, and a sulfosuccinic acid or its salt. The cationic surfactant in the aqueous slurry may comprise any one or a mixture of a primary amine or its salt, a secondary amine or its salt, a tertiary amine or its salt, and a quaternary amine or its salt. The nonionic surfactant may comprise any one or a mixture of one of many polyethylene glycols.

Still yet other embodiments of aqueous slurries may be provided with a copper corrosion inhibitor which may comprise any one or a mixture of heterocyclic organic compounds including benzotriazole (BTA), benzimidazole, poly triazole, phenyl triazole, thion and their derivatives. Further embodiments of slurries may contain any combination of these surfactants and corrosion inhibitors.

The oxidizing agents may oxidize the copper as well as react with molybdate ions present in the slurry. The new per-molybdate or peroxy-molybdate ions are expected to further oxidize and complex with copper, thereby providing high polish rates. Similar high polishing action may also occur by use of tungstates, vanadates, chromates and similar transition metal oxide ions or peroxy ions with or without the molybdate ions.

Aqueous slurries may optionally include acids or bases for adjusting the pH within an effective range from about 1 to about 14. Yet additional embodiments of slurries according to the invention may also be provided with supplemental ceramic/metal oxide particles. The supplemental ceramic/metal oxide particles may be added as colloidal particles or as fumed Aerosil® particles. Such supplemental ceramic/metal oxide particles used in the aqueous slurry may comprise any one or a mixture of silica, ceria, aluminia, zirconia, titania, magnesia, iron oxide, tin oxide, and germania.

The present invention also includes a novel method of planarizing copper by chemical-mechanical planarization. The method of the present invention comprises providing an aqueous slurry comprising dissolved soluble salts of molybdenum in deionized water and an oxidizing agent. The method further comprises polishing copper with the aqueous slurry using a polishing pad and pressures in a range of about 0.5 psi to about 6.0 psi, and more preferably between about 0.5 psi and about 2.0 psi.

The present invention also includes another novel method of planarizing copper. The method of the present invention comprises providing an aqueous slurry comprising dissolved $MoO_3$ and an oxidizing agent. The method further comprises polishing copper with the aqueous slurry using a polishing pad at pressures between about 0.5 psi and about 6.0 psi, and more preferably between about 0.5 psi and about 2.0 psi.

The present invention also includes yet another novel method of planarizing copper by chemical-mechanical planarization. The method of the present invention comprises providing an aqueous slurry comprising dissolved $MoO_2$ and an oxidizing agent and polishing copper with the aqueous slurry using a polishing pad at pressures between about 0.5 psi and about 6.0 psi, and more preferably between about 0.5 psi and about 2.0 psi.

DETAILED DESCRIPTION OF THE PREFERRED EMBODIMENTS

Broadly described, embodiments of aqueous slurries according to the present invention may comprise a molybdenum oxide ($MoO_2$) polishing material and an oxidizing agent. The $MoO_2$ polishing material may be present in an amount of about 0.5 to about 10 wt. %, such as about 1 to about 3 wt. %, and more preferably in an amount of about 3 wt. %. The molybdenum oxide polishing material may comprise fine particles of $MoO_2$ having a mean particle size in the range of about 25 nanometers (nm) to about 1 micron, such as about 25 nanometers to about 560 nm, and more preferably about 50 to 200 nm, as measured by a Horiba laser scattering analyzer.

The $MoO_2$ particles may be produced from a variety of molybdenum-containing precursor materials, such as, for example, ammonium molybdates and related compounds, as well as molybdenum oxides prepared from a variety of processes known in the art, wherein molybdenum precursors and products can be made into particles within the size ranges specified herein. Alternatively particles of $MoO_2$ may be reduced in size to the ranges specified herein by any of a variety of milling methods known in the art, such as attrition milling assisted by the use of appropriate reagents.

By way of example, embodiments of slurries according to the present invention may utilize particles of $MoO_2$ produced from a precursor material comprising nano-particles of $MoO_3$. Nano-particles of $MoO_3$ are commercially available from the Climax Molybdenum Company of Ft. Madison, Iowa (US). Alternatively, nano-particles of $MoO_3$ may be produced in accordance with the teachings provided in U.S. Pat. No. 6,468,497 B1, entitled "Method for Producing Nano-Particles of Molybdenum Oxide," which is hereby incorporated herein by reference for all that it discloses.

Regardless of whether the nano-particles of $MoO_3$ are obtained commercially or manufactured in accordance with the teachings provided in U.S. Pat. No. 6,468,497 B1, identified above, the $MoO_2$ particles comprising the polishing material may be produced by heating nano-particles of $MoO_3$ for a time sufficient to convert substantially all of the $MoO_3$ to $MoO_2$. More specifically, the nano-particles of $MoO_3$ may be heated in a reducing atmosphere (e.g., hydrogen) to a temperature in the range of about 400 C. to about 700 C. (550 C. preferred). Times may be in the range of about 30 to about 180 minutes, as may be required to reduce $MoO_3$ to $MoO_2$ in sufficient quantities. Heating may be accomplished in a rotary furnace, although other types of furnaces may be used. If necessary, the resulting $MoO_2$ product may then be ground to produce an $MoO_2$ polishing material having a mean particle diameter within the ranges specified herein. A particle classification step may optionally be used to ensure that the resulting $MoO_2$ polishing material lacks particles that may cause damage during polishing.

The oxidizing agent may comprise any one or a mixture of ferric nitrate ($Fe(NO_3)_3$), nitric acid ($HNO_3$), potassium iodide (KI), and potassium iodate ($KIO_3$). Ferric nitrate oxidizing agent may be present in concentrations ranging from about 0.05 to about 0.2 molar (M) $Fe(NO_3)_3$, such as about 0.1 to about 0.2M $Fe(NO_3)_3$, and more preferably in a concentration of about 0.2 M $Fe(NO_3)_3$. Nitric acid oxidizing agent may be present in amounts ranging from about 0.5 to about 2 wt. % $HNO_3$, such as about 1 to about 2 wt. % $HNO_3$, and more preferably in an amount of about 2 wt. % $HNO_3$. Potassium iodide oxidizing agent may be present in amounts ranging from about 0.5 to about 5 wt. % KI, such as about 1 to about 5 wt. % KI, and more preferably in an amount of about 3 wt. % KI. Potassium iodate oxidizing agent may be present in amounts ranging from about 1 to about 5 wt. % $KIO_3$, such as about 1 to about 3 wt. % $KIO_3$, and more preferably in an amount of about 3 wt. % $KIO_3$.

Additional oxidizing agents may comprise any one or a mixture of hydroxylamine hydrochloride (($NH_2OH$)Cl) and potassium permanganate ($KMnO_4$). Hydroxylamine hydrochloride oxidizing agent may be present in amounts ranging from about 1 to about 5 wt. % ($NH_2OH$)Cl, such as about 2 to about 4 wt. % ($NH_2OH$)Cl, and more preferably in an amount of about 3 wt. % ($NH_2OH$)Cl. Potassium permanganate oxidizing agent may be present in amounts ranging from about 1 to about 5 wt. % $KMnO_4$, such as about 2 to about 4 wt. % $KMnO_4$, and more preferably in an amount of about 3 wt. % $KMnO_4$. However, the polishing rates with slurries containing hydroxylamine hydrochloride and potassium permanganate are generally lower than with the other oxidizing agents identified herein.

Embodiments of slurries according to the present invention may also be provided with an anionic surfactant or a cationic surfactant. The anionic surfactant used in the aqueous slurry may comprise any one or a mixture of polyacrylic acid (PAA), a carboxylic acid or its salt, a sulfuric ester or its salt, a sulfonic acid or its salt, a phosphoric acid or its salt, and a sulfosuccinic acid or its salt. The cationic surfactant used in the aqueous slurry may comprise any one or a mixture of a primary amine or its salt, a secondary amine or its salt, a tertiary amine or its salt, and a quaternary amine or its salt. Optionally, the aqueous slurry may be provided with a copper corrosion inhibitor which may comprise any one or a mixture of heterocyclic organic compounds including benzotriazole (BTA), triazole, and benzimidazole. Further, the slurry may contain any combination of these surfactants and corrosion inhibitors.

A preferred anionic surfactant is polyacrylic acid (PAA). A preferred cationic surfactant is cetyl pyridinium chloride (CPC). A preferred copper corrosion inhibitor is benzotriazole (BTA). The addition of PAA improved slurry dispersability and surface quality. It is believed that the addition of PAA modifies the surface charge of the molybdenum oxide particles such that interaction between the molybdenum oxide particles and copper is favorable, leading to an increase in the polish rate. Polyacrylic acid (PAA) surfactant may be present in amounts ranging from about 0.1 to about 4 wt. % PAA, such as about 0.5 to about 1 wt. % PAA, and more preferably in an amount of about 1 wt. % PAA. The cationic surfactant cetyl pyridinium chloride (CPC) may be present in amounts ranging from about 0.01 to about 1 wt. % CPC, such as about 0.05 to about 0.5 wt. % CPC, and more preferably in an amount of about 0.1 wt. % CPC. Benzotriazole (BTA) copper corrosion inhibitor may be present in concentrations ranging from about 0.5 to about 10 milli-molar (mM) BTA, such as about 1 to about 5 mM BTA, and more preferably in a concentration of about 1 mM BTA.

Embodiments of slurries according to the present invention may also be provided with amounts of molybdenum sulfide ($MoS_2$) as a lubricant. It has been found that the addition of molybdenum sulfide particles increases the polish rate of copper for slurries containing $KIO_3$ and PAA. Molybdenum sulfide particles may have mean diameters in the range of about 0.01 to about 1 micron. Molybdenum sulfide particles may be present in amounts ranging from about 0.1 to about 10 wt. % $MOS_2$, such as about 0.5 to about 5 wt. % $MOS_2$, and more preferably in an amount of about 1 wt. % $MOS_2$. Molybdenum sulfide particles having the size ranges herein are commercially available from the Climax Molybdenum Company of Ft. Madison, Iowa (US).

The pH of embodiments of slurries according to the present invention may be in the range of about 1 to about 14, such as a pH in the range of about 3 to about 7, and preferably having a pH of 4. The pH of embodiments of slurries according to the present invention may be adjusted by the addition of suitable acids (e.g., hydrochloric acid (HCl)) or bases (e.g., potassium hydroxide (KOH)), as would be known by persons having ordinary skill in the art.

Yet additional embodiments of planarizing slurries according to the invention may also be provided with supplemental ceramic/metal oxide particles. Such supplemental ceramic/metal oxide particles used in the aqueous slurry may comprise any one or a mixture of silica, ceria, aluminia, zirconia, titania, magnesia, iron oxide, tin oxide, and germania.

Embodiments of slurries according to the present invention exhibit high polish rates for copper when used in the CMP process. More particularly, when potassium iodate ($KIO_3$) was used as an oxidizing agent in the molybdenum oxide slurries very high copper disk and copper film polish rates (e.g., up to ~1000 and 470 nm/min, respectively, were obtained, as detailed in the following examples. Addition of PAA enhanced the film polish rate to about 667 nm/min. Further, when molybdenum sulfide particles were added to slurries containing $KIO_3$ and PAA, copper film polish rates of about 750 nm/min were obtained.

While polish rates with the $KIO_3$-based slurries of the present invention are high for copper, the post-polish surface of the copper tended to be covered with a thick, uneven misty layer with roughness values as high as about 150 nm as measured by a non-contact optical profilometer. If the post-polish surface quality is desired to be higher, the CMP polishing step may be followed by a buffing step. In one embodiment, the buffing step involved additionally polishing the copper surface with a dilute suspension of $H_2O_2$, glycine, BTA, and colloidal silica in de-ionized water at a pH of 4. The advantage of using an $H_2O_2$-based buffing step is that $H_2O_2$ reacts spontaneously with molybdenum oxide, thus removing residual amounts of molybdenum oxide that may remain on the surface. Very clean and smooth copper surfaces were obtained after subsequent buffing, some with roughness values as low as 0.35 nm as measured by a non-contact optical profilometer.

Polishing selectivity of one embodiment of a slurry of the present invention between Cu, Ta, and silicon oxide ($SiO_2$) was determined to be 235:1:1 for Cu:Ta:$SiO_2$, as presented in Example 24.

Examples 25 and 26 involve the addition of ethylene diamine tetra acetic acid (EDTA) to test the complexing ability of EDTA with copper ions. The polish rates for the two specified slurry compositions are presented in Table 5.

In order to provide further information regarding the invention, the following examples are provided. The examples presented below are representative only and are not intended to limit the invention in any respect.

EXAMPLES 1-15

Slurries of examples 1-15 were used to polish a copper disk having a diameter of 1.25 inches. The CMP polisher was a Struers DAP® with an IC-1400, k-groove polishing pad. The carrier remained stationary (i.e., was not rotated). The rotation rate of the platen was 90 revolutions per minute (rpm). The down-force placed on the copper disk was 6.3 pounds per square inch (psi). The slurry flow rate was 60 ml/min. The amount of copper removed from the surface of the disk by CMP was determined by measuring the weight difference of the copper disk both before and after polishing, taking into consideration the density of the Cu material, the area of the disk that was polished, and the polishing time. This was then converted into the rate of removal in terms of nm of copper removed per minute.

The slurries of examples 1-10 all contained 3 wt. % molybdenum oxide ($MoO_2$) in deionized water. The mean particle size of molybdenum oxide for examples 1-10 was 1 micron (1000 nm). The mean particle size of molybdenum oxide for examples 11-15 was 150 nm. Various amounts and types of oxidizing agents were added, as identified in Table 1. Example 11 contained 1.5 wt. % $MoO_2$ with 3 wt. % hydroxylamine hydrochloride (($NH_2OH$)Cl) as an oxidizing agent. Example 12 contained 1.5 wt. % $MoO_2$ with 3 wt. % potassium permanganate ($KMnO_4$) as the oxidizing agent. Examples 13-15 all contain 3 wt. % $KIO_3$ with varying amounts of $MoO_2$, as noted. The pH of slurries for examples 1-15 was adjusted to 4.0 by the addition of hydrochloric acid (HCl)—or potassium hydroxide (KOH). The slurry compositions and polishing rates for the copper disk are presented in Table 1.

TABLE 1

| Example | Slurry Composition | Mean Particle Size (nm) | pH | Polish Rate (nm/min) |
|---|---|---|---|---|
| 1 | 3% $MoO_2$ + 0.05M Fe($NO_3$)$_3$ | 1000 | 4 | 69 |
| 2 | 3% $MoO_2$ + 0.1M Fe($NO_3$)$_3$ | 1000 | 4 | 88 |
| 3 | 3% $MoO_2$ + 0.2M Fe($NO_3$)$_3$ | 1000 | 4 | 230 |
| 4 | 3% $MoO_2$ + 0.5% $HNO_3$ | 1000 | 4 | 348 |
| 5 | 3% $MoO_2$ + 1% $HNO_3$ | 1000 | 4 | 221 |
| 6 | 3% $MoO_2$ + 2% $HNO_3$ | 1000 | 4 | 353 |
| 7 | 3% $MoO_2$ + 3% KI | 1000 | 4 | 157 |
| 8 | 3% $MoO_2$ + 1% $KIO_3$ | 1000 | 4 | 123 |
| 9 | 3% $MoO_2$ + 2% $KIO_3$ | 1000 | 4 | 345 |
| 10 | 3% $MoO_2$ + 3% $KIO_3$ | 1000 | 4 | 1014 |
| 11 | 1.5% $MoO_2$ + 3%($NH_2OH$)Cl | 150 | 4 | 68 |
| 12 | 1.5% $MoO_2$ + 3% $KMnO_4$ | 150 | 4 | 31 |
| 13 | 1% $MoO_2$ + 3% $KIO_3$ | 150 | 4 | 169 |
| 14 | 2% $MoO_2$ + 3% $KIO_3$ | 150 | 4 | 524 |
| 15 | 3% $MoO_2$ + 3% $KIO_3$ | 150 | 4 | 862 |

EXAMPLES 16-18

Slurries of examples 16-18 were used to polish a copper film deposited on a silicon substrate by sputter deposition. The copper film had a diameter of 6 inches. The CMP polisher was a Westech Model 372 with an IC-1400, k-groove polishing pad. The carrier was rotated at a rate of 40 rpm. The platen was rotated at 40 rpm. The down-force placed on the copper film was 6 pounds per square inch (psi). The slurry flow rate was set at 200 ml/min.

The amount of copper removed from the surface of the silicon substrate by CMP was determined by measuring the sheet resistance of the Cu film both before and after polishing at 17 points spread across the film utilizing a home-made paper mask and a 4-point probe. Sheet resistance was measured at the same points on the film before and after polishing. The measured sheet resistances both before and after polishing were then converted to respective film thicknesses before and after polishing based on the resistivity of the Cu material, the current applied, and the voltage across the 4-point probe. The difference between the starting and final thicknesses as 17 points were calculated, an average thickness loss was obtained which as then divided by the polish time to give the polish rate in nm/min.

The slurries all contained 3 wt. % molybdenum oxide ($MoO_2$) in deionized water and with a potassium iodate ($KIO_3$) oxidizing agent present in an amount of 3 wt. %. The mean particle size of the molybdenum oxide for examples 16-18 was 1 micron (1000 nm). Example 17 added 1 wt. % PAA to the slurry. Example 18 added 1 wt. % PAA and 1 wt. % molybdenum sulfide ($MOS_2$) to the slurry. The pH of the slurries of examples 16-18 was adjusted to 4.0 by the addition of hydrochloric acid (HCl) or potassium hydroxide (KOH). The slurry compositions and polishing rates for the copper film are presented in Table 2.

TABLE 2

| Example | Slurry Composition | Mean Particle Size (nm) | pH | Polish Rate (nm/min) |
|---|---|---|---|---|
| 16 | 3% $MoO_2$ + 3% $KIO_3$ | 1000 | 4 | 471 |
| 17 | 3% $MoO_2$ + 3% $KIO_3$ + 1% PAA | 1000 | 4 | 667 |
| 18 | 3% $MoO_2$ + 3% $KIO_3$ + 1% PAA + 1% $MoS_2$ | 1000 | 4 | 750 |

EXAMPLES 19-23

Slurries of examples 19-23 were used to polish a copper film deposited on a silicon substrate by sputter deposition. The copper film had a diameter of 6 inches. The CMP polisher was a Westech Model 372 with an IC-1400, k-groove polishing pad. The carrier was rotated at a rate of 75 rpm. The platen was also rotated at 75 rpm. The down-force placed on the copper film was 4 pounds per square inch (psi). The slurry flow rate was set at 200 ml/min.

The amount of copper removed from the surface of the silicon substrate by CMP was determined by measuring the sheet resistance of the Cu film both before and after polishing at 17 points spread across the film utilizing a home-made paper mask and a 4-point probe. Sheet resistance was measured at the same points on the film before and after polishing. The measured sheet resistances both before and after polishing were then converted to respective film thicknesses before and after polishing based on the resistivity of the Cu material, the current applied, and the voltage across the 4-point probe. The difference between the starting and final thicknesses as 17 points were calculated, an average thickness loss was obtained which was then divided by the polish time to give the polish rate in nm/min.

The slurries all contained 3 wt. % molybdenum oxide ($MoO_2$) in deionized water and with a potassium iodate ($KIO_3$) oxidizing agent present in an amount of 3 wt. %. The mean particle diameter of the molybdenum oxide for examples 19-23 was 150 nm. Example 20 added 1 mM benzotriazole (BTA) to the slurry. Example 21 added 1 wt. % polyacrylic acid (PAA) to the slurry. Example 22 added 0.1 wt. % cetyl pyridinium chloride (CPC) to the slurry. Example 23 added 2 wt. % PAA and 1 mM BTA to the slurry. The pH of the slurries of examples 19-23 was adjusted to 4.0 by the addition of hydrochloric acid (HCl) or potassium hydroxide (KOH). The slurry compositions and polishing rates for the copper film are presented in Table 3.

TABLE 3

| Example | Slurry Composition | Mean Particle Size (nm) | pH | Polish Rate (nm/min) |
|---|---|---|---|---|
| 19 | 3% $MoO_2$ + 3% $KIO_3$ | 150 | 4 | 695 |
| 20 | 3% $MoO_2$ + 3% $KIO_3$ + 1 mM BTA | 150 | 4 | 471 |
| 21 | 3% $MoO_2$ + 3% $KIO_3$ + 1% PAA | 150 | 4 | 997 |
| 22 | 3% $MoO_2$ + 3% $KIO_3$ + 0.1% CPC | 150 | 4 | 913 |
| 23 | 3% $MoO_2$ + 3% $KIO_3$ + 2% PAA + 1 mM BTA | 150 | 4 | 660 |

EXAMPLE 24

Silicon wafers (6 inch diameter) having a 0.3 micron Ta layer deposited by sputter deposition and wafers having a 1 micron $SiO_2$ layer applied by thermal oxidation were separately polished with a polishing slurry. The amount of copper and Ta removed was determined using a four-point probe, and $SiO_2$ removed from the surface of the silicon wafer by CMP was measured using an optical interferometer, in order to determine the rate of removal in terms of nm of material removed per minute.

The slurry utilized comprised 3 wt % molybdenum oxide ($MoO_2$) in deionized water with potassium iodate ($KIO_3$) oxidizing agent present in an amount of 3 wt. %. The mean particle size of the molybdenum oxide for example 24 was 1 micron (1000 nm). The CMP polisher was a Westech Model 372 with an IC-1400, k-groove polishing pad. The carrier was rotated at a rate of 40 rpm. The platen was also rotated at 40 rpm. The down-force placed on the copper film was 6 pounds per square inch (psi). The slurry flow rate was 200 ml/min. The slurry composition and polishing rates for Cu, Ta, and $SiO_2$ are presented in Table 4.

TABLE 4

| Example | Slurry Composition | Cu Polish Rate (nm/min) | Ta Polish Rate (nm/min) | $SiO_2$ Polish Rate (nm/min) |
|---|---|---|---|---|
| 24 | 3% $MoO_2$ + 3% $KIO_3$ | 471 | 2 | 2 |

EXAMPLES 25 and 26

Slurries of examples 25 and 26 were used to polish a copper disk having a diameter of 1.25 inches. The CMP polisher was a Struers DAP® with an IC-1400, k-groove polishing pad. The carrier remained stationary (i.e., was not rotated). The rotation rate of the platen was 90 revolutions per minute (rpm). The down-force placed on the copper disk was 6.3 pounds per square inch (psi). The slurry flow rate was 60 ml/min. The amount of copper removed from the surface of the disk by CMP was determined by measuring the weight difference of the copper disk both before and after polishing, taking into consideration the density of the Cu material, the area of the disk that was polished, and the polishing time. This was then converted into the rate of removal in terms of nm of copper removed per minute.

The slurries of examples 25 and 26 all contained 3 wt. % molybdenum oxide ($MoO_2$) in deionized water. The mean particle size of molybdenum oxide for both examples 25 and 26 was 1 micron (1000 nm). Various amounts and types of oxidizing agents were added, as identified in Table 5. Slurries of both examples included the addition of 1 wt. % ethylene diamine tetra acetic acid (EDTA) to test the complexing ability of EDTA with copper ions. The slurry compositions and polishing rates for the copper disk are presented in Table 5.

TABLE 5

| Example | Slurry Composition | Mean Particle Size (nm) | pH | Polish Rate (nm/min) |
|---|---|---|---|---|
| 25 | 3% $MoO_2$ + 3% KI + 1% EDTA | 1000 | 4 | 146 |
| 26 | 3% $MoO_2$ + 3% KI + 1% $KMnO_4$ + 1% EDTA | 1000 | 4 | 259 |

Another embodiment of an aqueous slurry may comprise molybdenum trioxide ($MoO_3$) and an oxidizing agent. The $MoO_3$ may be present in an amount of about 0.1 to about 10 wt. %, such as about 0.5 to about 10 wt. %, and more preferably in an amount of about 0.5 to about 5 wt. %. The molybdenum trioxide ($MoO_3$) may be provided in powder form such that the molybdenum trioxide ($MoO_3$) visibly dissolves or substantially visibly dissolves in the oxidizing agent. The molybdenum trioxide powder may have a mean particle size of about 10,000 nm (10 microns) and more preferably less than about 1,000 nm (1 micron), as measured by a Horiba laser scattering analyzer. Generally speaking molybdenum trioxide ($MoO_3$) powders having these sizes are visibly dissolved in an aqueous solution of deionized water and the oxidizing agent. As used herein, the terms "dissolved" and "visibly dissolved," refer to solutions wherein the particles of $MoO_3$ are at least partially, although not necessarily completely, dissolved. Stated another way, solutions containing particles of $MoO_3$ may appear substantially clear or "visibly dissolved" to the naked eye, even though the particles of $MoO_3$ may not be completely dissolved.

An alternative embodiment of an aqueous slurry may comprise molybdic acid. The dissolution of molybdenum trioxide in an aqueous solution of deionized water and an oxidizing agent may form molybdic acid. In addition, molybdic acid may be formed by dissolving molybdenum metal, molybdenum oxides, or molybdates in an oxidizing medium. The term "molybdic acid" as used herein refers to any compound containing molybdenum and capable of transferring a hydrogen ion in solution. Embodiments of the aqueous slurry of the present invention utilizing molybdic acid may comprise the same oxidizing agents, complexing agents, surfactants, corrosion inhibitors, acids or bases, and supplemental ceramic/metal oxide particles as are listed below for the molybdenum trioxide aqueous slurry.

The $MoO_3$ particles may be produced from a variety of molybdenum-containing precursor materials, such as, for example, ammonium molybdates and related compounds, as well as molybdenum oxides prepared from a variety of processes known in the art, wherein molybdenum precursors and products can be made into particles of varying sizes. Molybdenum trioxide particles suitable for use in the present invention are commercially available from a wide variety of sources, including the Climax Molybdenum Company of Ft. Madison, Iowa (US).

The oxidizing agent used with molybdenum trioxide ($MoO_3$) may comprise any one or a mixture of hydrogen peroxide ($H_2O_2$), ferric nitrate ($Fe(NO_3)_3$), potassium iodate ($KIO_3$), nitric acid ($HNO_3$), potassium permanganate ($KMnO_4$), potassium persulfate ($K_2S_2O_8$), ammonium persulfate (($NH_4)_2S_2O_8$), potassium periodate ($KIO_4$), and hydroxylamine ($NH_2OH$). Hydrogen peroxide oxidizing agent may be present in concentrations ranging from about 0.5 to about 20 wt % $H_2O_2$, such as about 1 to about 10 wt % $H_2O_2$, and more preferably in a concentration of about 5 wt % $H_2O_2$. Ferric nitrate oxidizing agent may be present in concentrations ranging from about 0.05 to about 0.2 molar (M) $Fe(NO_3)_3$, such as about 0.1 to about 0.2 M $Fe(NO_3)_3$, and more preferably in a concentration of about 0.2 M $Fe(NO_3)_3$. Potassium iodate oxidizing agent may be present in concentrations ranging from about 1 to about 5 wt % $KIO_3$, such as about 1 to about 3 wt % $KIO_3$, and more preferably in a concentration of about 3 wt % $KIO_3$. Nitric acid oxidizing agent may be present in concentrations ranging from about 0.5 to about 2 wt % $HNO_3$, such as about 1 to about 2 wt % $HNO_3$, and more preferably in a concentration of about 2 wt % $HNO_3$. Potassium permanganate oxidizing agent may be present in concentrations ranging from about 1 to about 5 wt % $KMnO_4$, such as about 2 to about 4 wt % $KMnO_4$, and more preferably in a concentration of about 3 wt % $KMnO_4$. Potassium persulfate oxidizing agent may be present in concentrations ranging from about 1 to about 5 wt % $K_2S_2O_8$, such as about 2 to about 4 wt % $K_2S_2O_8$, and more preferably in a concentration of about 3 wt % $K_2S_2O_8$. Ammonium persulfate oxidizing agent may be present in concentrations ranging from about 1 to about 5 wt % $(NH_4)_2S_2O_8$, such as about 2 to about 4 wt % $(NH_4)_2S_2O_8$, and more preferably in a concentration of about 3 wt % $(NH_4)_2S_2O_8$. Potassium periodate oxidizing agent may be present in concentrations ranging from about 1 to about 5 wt %-$KIO_4$, such as about 2 to about 4 wt % $KIO_4$, and more preferably in a concentration of about 3 wt % $KIO_4$. Hydroxylamine oxidizing agent may be present in concentrations ranging from about 1 to about 5 wt % $NH_2OH$, such as about 2 to about 4 wt % $NH_2OH$, and more preferably in a concentration of about 3 wt % $NH_2OH$.

Additionally, complexing agents may be used in the molybdenum trioxide ($MoO_3$) aqueous slurry. Complexing agents may comprise any one or a mixture of glycine ($C_2H_5NO_2$), alanine ($C_3H_7NO_2$), amino butyric acids ($C_4H_9NO_2$), ethylene diamine ($C_2H_8N_2$), ethylene diamine tetra acetic acid (EDTA), ammonia ($NH_3$), family of mono, di, and tri-carboxylic acids like citric acid ($C_6H_8O_7$), phthalic acid ($C_6H_4(COOH)_2$), oxalic acid ($C_2H_2O_4$), acetic acid ($C_2H_4O_2$), and succinic acid ($C_4H_6O_4$) and family of amino benzoic acids ($C_7H_7NO_2$).

Glycine complexing agent may be present in amounts ranging from about 0.1 to about 5 wt. % $C_2H_5NO_2$, such as about 0.1 to about 3 wt. % $C_2H_5NO_2$, and more preferably in an amount of about 0.5 wt. % $C_2H_5NO_2$. Alanine complexing agent may be present in amounts ranging from about 0.1 to about 5 wt. % $C_3H_7NO_2$, such as about 0.1 to about 3 wt. % $C_3H_7NO_2$, and more preferably in an amount of about 0.5 wt. % $C_3H_7NO_2$. Amino butyric acid complexing agent may be present in amounts ranging from about 0.1 to about 5 wt. % $C_4H_9NO_2$, such as about 0.1 to about 3 wt. % $C_4H_9NO_2$, and more preferably in an amount of about 0.5 wt. % $C_4H_9NO_2$. Ethylene diamine complexing agent may be present in amounts ranging from about 0.1 to about 5 wt. % $C_2H_8N_2$, such as about 0.1 to about 3 wt. % $C_2H_8N_2$, and more preferably in an amount of about 0.5 wt. % $C_2H_8N_2$. Ethylene diamine tetra acetic acid complexing agent may be present in amounts ranging from about 0.1 to about 5 wt. % EDTA, such as about 0.1 to about 3 wt. % EDTA, and more preferably in an amount of about 0.5 wt. % EDTA. Ammonia complexing agent may be present in amounts ranging from about 0.1 to about 5 wt. % $NH_3$, such as about 0.1 to about 3 wt. % $NH_3$, and more preferably in an amount of about 0.5 wt. % $NH_3$. Citric acid complexing agent may be present in amounts ranging from about 0.1 to about 5 wt. % $C_6H_8O_7$ such as about 0.1 to about 3 wt. % $C_6H_8O_7$, and more preferably in an amount of about 0.5 wt. % $C_6H_8O_7$. Phthalic acid complexing agent may be present in amounts ranging from about 0.1 to about 5 wt. % $C_6H_4(COOH)_2$ such as about 0.1 to about 3 wt. % $C_6H_4(COOH)_2$, and more preferably in an amount of about 0.5 wt. % $C_6H_4(COOH)_2$. Oxalic acid complexing agent may be present in amounts ranging from about 0.1 to about 5 wt. % $C_2H_2O_4$ such as about 0.1 to about 3 wt. % $C_2H_2O_4$, and more preferably in an amount of about 0.5 wt. % $C_2H_2O_4$. Acetic acid complexing agent may be present in amounts ranging from about 0.1 to about 5 wt. % $C_2H_4O_2$ such as about 0.1 to about 3 wt. % $C_2H_4O_2$, and more preferably in an amount of about 0.5 wt. % $C_2H_4O_2$. Succinic acid complexing agent may be present in amounts ranging from about 0.1 to about 5 wt. % $C_4H_6O_4$ such as about 0.1 to about 3 wt. % $C_4H_6O_4$, and more preferably in an amount of about 0.5 wt. % $C_4H_6O_4$. Amino benzoic acids as a complexing agent may be present in amounts ranging from about 0.1 to about 5 wt. % $C_7H_7NO_2$ such as about 0.1 to about 3 wt. % $C_7H_7NO_2$, and more preferably in an amount of about 0.5 wt. % $C_7H_7NO_2$.

Embodiments of slurries containing molybdenum trioxide ($MoO_3$) may also be provided with a nonionic surfactant, an anionic surfactant, or a cationic surfactant. The anionic surfactant used in the aqueous slurry may comprise any one or a mixture of polyacrylic acid (PAA), a carboxylic acid or its salt, a sulfuric ester or its salt, a sulfonic acid or its salt, a phosphoric acid or its salt, and a sulfosuccinic acid or its salt. The cationic surfactant used in the aqueous slurry may comprise any one or a mixture of a primary amine or its salt, a secondary amine or its salt, a tertiary amine or its salt, and a quaternary amine or its salt. The nonionic surfactant may be one or a mixture of one of the family of polyethylene glycols.

Optionally, the molybdenum trioxide ($MoO_3$) aqueous slurry may also be provided with a copper corrosion inhibitor which may comprise any one or a mixture of heterocyclic organic compounds including benzotriazole (BTA), benzimidazole, poly triazole, phenyl triazole, thion and their derivatives. Further, the slurry may contain any combination of these surfactants and corrosion inhibitors.

A preferred anionic surfactant used in the $MoO_3$ slurry is a salt of dodecyl benzene sulfonic acid. The addition of a small amount of the dodecyl benzene sulfonic acid (DBSA) anionic surfactant to the slurry drastically reduced copper coupon dissolution rates to about 0 nm/minute and blanket copper wafer polish rates of about 750 nm/minute were obtained. See Example 34. This low copper coupon dissolution rate indicates low dishing of copper lines during pattern wafer polishing. Dodecyl benzene sulfonic acid surfactant and salts thereof (DBSA) may be present in amounts ranging from about 0.00001 to about 1 wt. % (DBSA), such as about 0.0001 to about 0.5 wt. % (DBSA), and more preferably in an amount of about 0.001 wt. % (DBSA).

A preferred copper corrosion inhibitor used in the $MoO_3$ slurry is benzotriazole (BTA). The addition of BTA to the slurry brought down the dissolution rates drastically, to less than 50 nm/minute. See Examples 30-33. Benzotriazole (BTA) copper corrosion inhibitor may be present in concentrations ranging from about 1 to about 20 milli-molar (mM) BTA, such as about 1 to about 10 mM BTA, and more preferably in a concentration of about 10 mM BTA.

The pH of embodiments of $MoO_3$ slurries according to the present invention may be in the range of about 1 to about 14, such as a pH in the range of about 1 to about 5, and preferably having a pH of about 2.6. The pH of embodiments of slurries according to the present invention may be adjusted by the addition of suitable acids (e.g., acetic acid) or bases (e.g., potassium hydroxide), as would be known by persons having ordinary skill in the art.

Yet additional embodiments of $MoO_3$ polishing slurries according to the invention may also be provided with supplemental ceramic/metal oxide particles. Such supplemental ceramic/metal oxide particles used in the aqueous slurry may comprise any one or a mixture of silica, ceria, zirconia, titania, magnesia, iron oxide, tin oxide, and germania. A preferred supplemental ceramic/metal oxide used in the $MoO_3$ slurry is colloidal silicon dioxide ($SiO_2$). Colloidal silicon dioxide ($SiO_2$) may have an average particle size of about 20 nm.

Embodiments of $MoO_3$ slurries according to the present invention exhibit high polish rates for copper when used in the CMP process. More particularly, when molybdenum trioxide $MoO_3$ particles were dispersed and dissolved in an aqueous solution containing hydrogen peroxide and glycine and used as a copper CMP slurry, high disk polish rates (e.g., about 2150 nm/minute) were obtained. However, the copper coupon dissolution rates in this slurry were also high (e.g., about 1150 nm/minute). See Example 28. These high dissolution and disk polish rates indicate the active chemical nature of the slurry chemicals. One of the reasons why this slurry exhibits such a high chemical reactivity is due to the partial dissolution of the molybdenum trioxide $MoO_3$ nano-particles, which form molybdic acid. The copper dissolution rate gives an indication of the rate at which copper would be removed in those regions of the wafer that are not subject to mechanical abrasion. With proper choice of the concentrations of the additives and by inclusion of a corrosion inhibitor, polish rates can be tuned according to a user's requirements and dissolution rates can be minimized.

As shown in Examples 29 and 30, blanket copper wafer polishing rates of one embodiment of an $MoO_3$ slurry of the present invention were determined to be as high as about 1200 nm/minute with post CMP surface roughness of about 1 nm. The slurries of Examples 29 and 30 were filtered to remove particles above 1,000 nm (1 micron) in size and 1.0 wt % of 20 nm colloidal $SiO_2$ abrasives were added.

The post-polish surface of the copper was good with post CMP surface roughness values of about 1 nm as measured by a non-contact optical profilometer. If higher post-polish surface quality is desired, the CMP polishing step may be followed by a buffing step. In one embodiment, the buffing step may involve additionally polishing the copper surface with deionized water for about five to about fifteen seconds at a pH in the range of about 5 to about 7. The advantage of using a deionized water rinse buffing step is the removal of reactive chemicals from the wafer-pad interface, which removes residual amounts of molybdenum oxide that may remain on the surface of the wafer-pad. Clean and smooth copper surfaces were obtained after subsequent buffing using a deionized water rinse, some with roughness values as low as about 0.5 to 0.6 nm as measured by a non-contact optical profilometer.

With proper adjustment of the concentrations of the chemicals added and with a deionized water rinse for about five seconds at the end of the wafer polishing, very high polish rates (e.g., about 900 nm/minute) and very low post CMP roughness (e.g., about 0.5 to 0.6 nm) were obtained. Copper coupon dissolution rate in this slurry was low (e.g., about 40 nm/minute). When a small amount of an anionic surfactant, such as sodium dodecyl benzene sulfonate (SDBS), was added to the $MoO_3$ polishing slurry, copper coupon dissolution rates became about 0 nm/minute, indicating low dishing of copper lines during pattern wafer polishing, and blanket copper wafer polish rates of about 750 nm/minute were obtained. See Example 34.

The, general methodology for pattern wafer copper polishing is to polish the bulk copper initially at a high polish rate and then, as planarization is achieved, the copper polish rate is reduced in order to minimize dishing of copper lines. With proper adjustment of the slurry constituent composition and process parameters, the slurry of the present invention can be tuned for this general methodology of polishing at higher rates and then lower rates.

EXAMPLES 27 and 28

Slurries of examples 27 and 28 were used to polish a copper disk having a diameter of 32 millimeters (mm). The CMP polisher was a Struers DAP® with an IC-1400, k-groove polishing pad. The carrier remained stationary (i.e., was not rotated). The rotation rate of the platen was 90 revolutions per minute (rpm). The down-force placed on the copper disk was 6.3 pounds per square inch (psi). The slurry flow rate was 60 ml/min. The amount of copper removed from the surface of the disk by CMP was determined by measuring the weight difference of the copper disk both before and after polishing, taking into consideration the density of the copper material, the area of the disk that was polished, and the polishing time. This was then converted into the rate of removal in terms of nm of copper removed per minute.

Copper coupon dissolution experiments were performed in a 500 ml. glass beaker containing 400 ml. of the chemical solution. A copper coupon (i.e. 99.99% pure) of dimensions 25×25×1 mm was used as the experimental sample. The copper coupon was hand polished with 1500 grit sandpaper, washed with dilute hydrochloric acid (HCl) to remove copper oxides from the surface, dried in an air stream, and then weighed. The copper coupon was then immersed in the solution for three minutes while continuously stirring the solution. After the experiment, the copper coupon was washed repeatedly with a deionized water rinse, dried in an air stream, and weighed. Weight loss was used to calculate the dissolution rate.

Example 27 contained 1.0 wt. % $MoO_3$ in deionized (DI) water and Example 28 contained 1.0 wt. % $MoO_3$ in deionized (DI) water with 5.0% $H_2O_2$ and 1.0% glycine as an oxidizing agent and complexing agent, respectively. The natural pH of the Example 27 slurry was about 1.8. The natural pH of the Example 28 slurry was about 2.6. The remaining percentages not specified in the below table for the slurry compositions is the percentage of deionized water. In Example 27, the $MoO_3$ comprises 1% of the slurry composition and the deionized water comprises the remaining 99% of the slurry composition. The slurry compositions, copper coupon dissolution rates and polishing rates for the copper disk of Examples 27 and 28 are presented in Table 6.

TABLE 6

| Example | Slurry Composition | pH | Polish Rate (nm/min) | Dissolution Rate (nm/min) |
|---------|-------------------|-----|---------------------|--------------------------|
| 27 | 1.0% $MoO_3$ in DI Water | 1.8 | 60 | 20 |
| 28 | 1.0% $MoO_3$ + 5.0% $H_2O_2$ + 1.0% glycine in DI water | 2.6 | 2150 | 1140 |

EXAMPLES 29-34

Slurries of examples 29-34 were used to polish a copper film deposited on a silicon substrate by sputter deposition. The copper film had a diameter of 6 inches. The CMP polisher was a Westech Model 372 with an IC-1400, k-groove polishing pad. The carrier was rotated at a rate of 75 rpm. The platen was rotated at 75 rpm. The down-force placed on the copper film was 4 pounds per square inch (psi). The slurry flow rate was set at 200 ml/min.

The amount of copper removed from the surface of the silicon substrate by CMP was determined by measuring the sheet resistance of the copper film both before and after polishing at 17 points spread across the film utilizing a home-made paper mask and a 4-point probe. Sheet resistance was measured at the same points on the film before and after polishing. The measured sheet resistances both before and after polishing were then converted to respective film thicknesses before and after polishing based on the resistivity of the copper material, the current applied, and the voltage across the 4-point probe. The difference between the starting and final thicknesses as 17 points were calculated, an average thickness loss was obtained which was then divided by the polish time to give the polish rate in nm/min.

Copper coupon dissolution experiments were performed in a 500 ml. glass beaker containing 400 ml. of the chemical solution. A copper coupon (i.e. 99.99% pure) having dimensions of 25 mm×25 mm×1 mm was used as the experimental sample. The copper coupon was hand polished with 1500 grit sandpaper, washed with dilute hydrochloric acid (HCl) to remove any copper oxide from the surface, dried in an air stream, and then weighed. The copper coupon was then immersed in the solution for three minutes while continuously stirring the solution. After the experiment, the copper coupon was washed repeatedly with a deionized (DI) water rinse, dried in an air stream, and weighed. Weight loss was used to calculate the dissolution rate.

The slurries of Examples 29-34 contained 0.5 wt. % molybdenum trioxide ($MoO_3$) in deionized water. At the end of the wafer polishing a deionized (DI) water rinse was applied for five seconds. Example 29 contained 0.5% $MoO_3$+ 5.0% $H_2O_2$+1.0% glycine+5 mM BTA—filtered with 100 nm filter+1.0% $SiO_2$. The natural pH of the Example 29 slurry was about 2.9. Example 30 contained 0.5% $MoO_3$+5.0% $H_2O_2$+1.0% glycine +10 mM BTA—filtered with 100 nm filter+1.0% $SiO_2$. The natural pH of the Example 30 slurry was about 2.9. Example 31 contained 0.5% $MoO_3$+5% $H_2O_2$+0.5% glycine+10 mM BTA—filtered with 100 nm filter+0.1% $SiO_2$. The natural pH of the Example 31 slurry was about 2.6. Example 32 contained 0.5% $MoO_3$+5% $H_2O_2$+0.5% glycine+10 mM BTA—filtered with 100 nm filter+0.5% $SiO_2$. The natural pH of the Example 32 slurry was 2.6. Example 33 contained 0.5% $MoO_3$+5% $H_2O_2$+0.5% glycine+10 mM BTA—filtered with 100 nm filter+1.0% $SiO_2$. The natural pH of the Example 33 slurry was about 2.6. Example 34 contained 0.5% $MoO_3$+5% $H_2O_2$+0.5% glycine+10 mM BTA+0.001% SDBS—filtered with 100 nm filter +1.0% $SiO_2$. The natural pH for the slurry of Example 34 was about 2.6. The average size of the particles of $SiO_2$ in the slurries of Examples 29-34 was about 20 nm. The remaining percentages not specified in the below table for the slurry compositions is the percentage of deionized water in the slurry. The slurry compositions and polishing rates for the copper wafer along with the copper coupon dissolution rates for Examples 29-34 are presented in Table 7.

TABLE 7

| Example | Slurry Composition | Mean Particle Size of $SiO_2$ (nm) | pH | Polish Rate (nm/min) | Dissolution Rate (nm/min) |
|---|---|---|---|---|---|
| 29 | 0.5% $MoO_3$ + 5.0% $H_2O_2$ + 1.0% glycine + 5 mM BTA – filtered + 1.0% $SiO_2$ | 20 | 2.9 | 1250 | 70 |
| 30 | 0.5% $MoO_3$ + 5.0% $H_2O_2$ + 1.0% glycine + 10 mM BTA – filtered + 1.0% $SiO_2$ | 20 | 2.9 | 1225 | 40 |
| 31 | 0.5% $MoO_3$ + 5% $H_2O_2$ + 0.5% glycine + 10 mM BTA – filtered + 0.1% $SiO_2$ | 20 | 2.6 | 600 | 35 |
| 32 | 0.5% $MoO_3$ + 5% $H_2O_2$ + 0.5% glycine + 10 mM BTA – filtered + 0.5% $SiO_2$ | 20 | 2.6 | 775 | 35 |
| 33 | 0.5% $MoO_3$ + 5% $H_2O_2$ + 0.5% glycine + 10 mM BTA – filtered + 1.0% $SiO_2$ | 20 | 2.6 | 925 | 35 |
| 34 | 0.5% $MoO_3$ + 5% $H_2O_2$ + 0.5% glycine + 10 mM BTA + 0.001% SDBS – filtered + 1.0% $SiO_2$ | 20 | 2.6 | 750 | 0 |

EXAMPLES 35-37

Slurries of Examples 35-37 were used to polish six inch copper blanket films. The CMP polisher was a Westech 372 Wafer Polisher with an IC-1400, k-groove polishing pad. The rotation rate of the carrier was 75 revolutions per minute (rpm). The rotation rate of the platen was also 75 revolutions per minute (rpm). The down-force placed on the copper blanket film was 4.0 pounds per square inch (psi). The slurry flow rate was 200 ml/min.

The amount of copper removed from the surface of the silicon substrate by CMP was determined by measuring the sheet resistance of the copper film both before and after polishing at 17 points spread across the film utilizing a homemade paper mask and a 4-point probe. Sheet resistance was measured at the same points on the film before and after polishing. The measured sheet resistances both before and after polishing were then converted to respective film thicknesses before and after polishing based on the resistivity of the copper material, the current applied, and the voltage across the 4-point probe. The difference between the starting and final thicknesses as 17 points were calculated, an average thickness loss was obtained which was then divided by the polish time to give the polish rate in nm/min.

Copper coupon dissolution experiments were performed in a 500 ml. glass beaker containing 400 ml. of the chemical solution. A copper coupon (i.e. 99.99% pure) having dimensions of 25 mm×25 mm×1 mm was used as the experimental sample. The copper coupon was hand polished with 1500 grit sandpaper, washed with dilute hydrochloric acid (HCl) to remove copper oxides from the surface, dried in an air stream and weighed. The copper coupon was then immersed in the solution for three minutes while continuously stirring the solution. After the experiment, the copper coupon was washed repeatedly with deionized (DI) water, dried in an air stream, and weighed. Weight loss was used to calculate the dissolution rate.

Example 35 contained 1% $MoO_3$+5.0% $H_2O_2$+1.0% glycine+5 mM BTA—filtered with 100 nm filter+1.0% $SiO_2$. The natural pH of the Example 35 slurry was about 2.6. Example 36 contained 1% $MoO_3$+5.0% $H_2O_2$+1.0% glycine+10 mM BTA—filtered with 100 nm filter +1.0% $SiO_2$. The natural pH of the Example 36 slurry was about 2.6. Example 37 contained 1% $MoO_3$+5.0% $H_2O_2$+1.0% glycine+15 mM BTA—filtered with 100 nm filter+1.0% $SiO_2$. The natural pH of the Example 37 slurry was about 2.6. The remaining percentages not specified in the below table for the slurry compositions is the percentage of deionized water in the slurry. The slurry compositions and polishing rates for the copper wafer along with the copper coupon dissolution rates for Examples 35-37 are presented in Table 8.

TABLE 8

| Example | Slurry Composition | Mean Particle Size of $SiO_2$ (nm) | pH | Polish Rate (nm/min) | Dissolution Rate (nm/min) |
|---|---|---|---|---|---|
| 35 | 1% $MoO_3$ + 5.0% $H_2O_2$ + 1.0% glycine + 5 mM BTA – filtered + 1.0% $SiO_2$ | 20 | 2.6 | 1230 | 55 |
| 36 | 1% $MoO_3$ + 5.0% $H_2O_2$ + 1.0% glycine + 10 mM BTA – filtered + 1.0% $SiO_2$ | 20 | 2.6 | 1120 | 50 |
| 37 | 1% $MoO_3$ + 5.0% $H_2O_2$ + 1.0% glycine + 15 mM BTA – filtered + 1.0% $SiO_2$ | 20 | 2.6 | 760 | 35 |

The open circuit potential of a copper coupon in the $MoO_3$ slurry was noble to that of a tantalum coupon indicating that galvanic corrosion of copper will not be a problem during pattern wafer polishing which will minimize the dishing of copper lines. The details of the experimental procedure in obtaining these results are as follows. EG&G model 273A Potentiostat/Galvanostat was used to perform potentiodynamic polarization experiments. A three-electrode configuration consisting of a working electrode (Cu/Ta coupon), platinum counter electrode, and a saturated calomel electrode (SCE) as a reference electrode was used. The three electrodes are immersed in a 250 ml of the chemical solution and the potential of the working electrode was scanned from −750 mV to about 1000 mV with respect to open circuit potential (OCP) and the resulting current density was monitored using a EG&G Princeton Applied Research model 352 softcorr TM II corrosion software.

The general method for pattern wafer polishing is to polish the bulk copper initially at a high rate and as planarization is achieved, the copper is removed at a lower rate in order to minimize dishing of copper lines. With proper adjustment of the $MoO_3$ slurry constituent composition and process parameters, the $MoO_3$ slurry of the present invention may be tuned for this general method of polishing at a higher rate and then a lower rate. Tantalum dissolution and disk polish rates with the same $MoO_3$ slurry were both less than 5 nm/minute. High copper blanket wafer removal rates, high selectivity to tantalum, good post CMP surface finish and low abrasive content, leading to a reduced number of post CMP defects and easier post CMP cleaning, make this slurry an attractive candidate for the first step of copper CMP process.

Another embodiment of an aqueous slurry may comprise one or more soluble salts of molybdenum dissolved in deionized water and an oxidizing agent. Molybdenum forms salts with valencies of 3, 4, or 6, but the hexavalent salts are the most stable. Soluble salts of molybdenum may be recovered from primary or secondary sources of molybdenum and may include ammonium molybdates such as ammonium dimolybdate $(NH_4)_2Mo_2O_7$ (ADM), ammonium heptamolybdate $(NH_4)_6Mo_7O_{24}$ (AHM), and ammonium octamolybdate $(NH_4)_4Mo_8O_{26}$ (AOM). In addition, molybdate salts of sodium, potassium, iron, and other transition metal elements may be used.

The soluble salt (or salts) of molybdenum may be present in an amount of about 0.1 to about 10 wt. %, and more preferably in an amount of about 0.5 to about 10 wt. %. The soluble salt of molybdenum may be provided in powder form such that the soluble salt of molybdenum dissolves in the solution of deionized water and an oxidizing agent. Generally speaking, soluble salts of molybdenum powders are completely visibly dissolved in an aqueous solution of deionized water and the oxidizing agent. As used herein, the terms "completely dissolved" and "visibly dissolved," refer to solutions wherein the majority of the particles of soluble salt of molybdenum are completely dissolved, and preferably wherein all of the particles of soluble salt of molybdenum are completely dissolved.

The oxidizing agent used with the soluble salt of molybdenum may comprise any one or a mixture of the oxidizing agents already described and present in the amounts specified earlier. Additionally, complexing agents may be used in the soluble salt of molybdenum aqueous slurry. Complexing agents may comprise any one or a mixture of the complexing agents already described and present in the amounts specified above.

Embodiments of slurries containing the soluble salt of molybdenum may also be provided with a nonionic surfactant, an anionic surfactant, or a cationic surfactant. The anionic surfactant used in the aqueous slurry may comprise any one or a mixture of polyacrylic acid (PAA), a carboxylic acid or its salt, a sulfuric ester or its salt, a sulfonic acid or its salt, a phosphoric acid or its salt, and a sulfosuccinic acid or its salt. The cationic surfactant used in the aqueous slurry may comprise any one or a mixture of a primary amine or its salt, a secondary amine or its salt, a tertiary amine or its salt, and a quaternary amine or its salt. The nonionic surfactant may be one or a mixture of one of the family of polyethylene glycols.

Optionally, the aqueous slurry comprising the soluble salt of molybdenum may also be provided with a copper corrosion inhibitor which may comprise any one or a mixture of heterocyclic organic compounds including benzotriazole (BTA), benzimidazole, poly triazole, phenyl triazole, thion and their derivatives. Further, the slurry may contain any combination of these surfactants and corrosion inhibitors.

A preferred anionic surfactant used in the soluble salt of molybdenum slurry is a salt of dodecyl benzene sulfonic acid. Dodecyl benzene sulfonic acid surfactant and salts thereof (DBSA) may be present in amounts ranging from about 0.00001 to about 1 wt. % (DBSA), such as about 0.0001 to about 0.5 wt. % (DBSA), and more preferably in an amount of about 0.001 wt. % (DBSA).

A preferred copper corrosion inhibitor used in the slurry comprising the soluble salt of molybdenum is benzotriazole (BTA). Benzotriazole (BTA) copper corrosion inhibitor may be present in concentrations ranging from about 1 to about 20 milli-molar (mM) BTA, such as about 1 to about 10 mM BTA, and more preferably in a concentration of about 10 mM BTA.

The pH of embodiments of slurries comprising the soluble salt of molybdenum according to the present invention may be in the range of about 1 to about 14, such as a pH in the range of about 1 to about 7, and preferably having a pH of in the range of about 4 to about 6. The pH of embodiments of slurries according to the present invention may be adjusted by the addition of suitable acids (e.g., acetic acid) or bases (e.g., potassium or ammonium hydroxide), as would be readily recognized by persons having ordinary skill in the art after having become familiar with the teachings provided herein.

Yet additional embodiments of polishing slurries comprising the soluble salt of molybdenum according to the invention may also be provided with supplemental ceramic/metal oxide particles. Such supplemental ceramic/metal oxide particles may be added to the aqueous slurry as colloidal particles or as fumed particles. Such supplemental ceramic/metal oxide particles used in the aqueous slurry may comprise any one or a mixture of silica, ceria, zirconia, titania, magnesia, iron oxide, tin oxide, and germania. A preferred supplemental ceramic/metal oxide used in the slurry is colloidal silicon dioxide ($SiO_2$). Colloidal silicon dioxide ($SiO_2$) may have an average particle size of between about 10 nm and about 100 nm, and more preferably of about 20 nm to about 50 nm.

Polishing slurries comprising the soluble salt of molybdenum may be utilized in a method for polishing copper by chemical-mechanical planarization. The method comprises providing an aqueous slurry comprising dissolved soluble salt of molybdenum and an oxidizing agent and polishing copper with the aqueous slurry using a polishing pad and a pressure between the copper and the polishing pad of about 0.5 psi and about 6.0 psi and more preferably between about 0.5 psi and about 2.0 psi.

Embodiments of soluble salt of molybdenum slurries according to the present invention exhibit high polish rates for copper when used in the CMP process, even when the CMP process is carried out at very low pressures (i.e., down forces) between the copper and the polishing pad. CMP processes carried out at high pressures (i.e., down forces) may cause undesirable delamination of lower-k dielectric layers. Accordingly, slurries according to the teachings provided herein allow copper CMP processes to be carried out at low pressures (i.e., down forces), such as pressures in a range of about 0.5-6.0 psi, and more preferably as low as 0.5-2.0 psi. Use of such low pressures minimizes the shear forces that act on the low-k layers of dielectric materials during the CMP process. Thus, the slurries described herein are desirable so that the copper CMP processes can be carried out at high throughput rates while minimizing defects such as microscratches, corrosion, dishing, erosion, as well as enabling high cleanability of the polished surface that has been exposed to a variety of chemicals and particles.

The high disk polish rates obtained from CMP processes carried out at low pressures (i.e., down forces), such as, for example, pressures in the range of about 0.5 to about 2.0 psi, indicates the active chemical nature of the slurry chemicals. With proper choice of the concentrations of the additives, surfactants, complexing agents, and by inclusion of a corrosion inhibitor and an abrasive, polish rates can be selected or "tuned" as desired or required (e.g., to manage the productivity of the copper CMP process).

EXAMPLES 38-42

Slurries of examples 38-42 were used to polish a copper disk having a diameter of 6 inches. The CMP polisher was a Struers DAP® with an IC-1400, k-groove polishing pad. The carrier remained stationary (i.e., was not rotated). The rotation rate of the platen was 90 revolutions per minute (rpm). The pressure (i.e., down-force) placed between the copper disk and polishing pad was 5 pounds per square inch (psi). The slurry flow rate was 60 ml/min. The amount of copper removed from the surface of the disk by CMP was determined by measuring the weight difference of the copper disk both before and after polishing, taking into consideration the density of the Cu material, the area of the disk that was polished, and the polishing time. This was then converted into the rate of removal in terms of nm of copper removed per minute.

The slurries of Examples 38-42 are all the same except that the weight percentage of the oxidizing agent, i.e. hydrogen peroxide $H_2O_2$, was varied for each example. Examples 38-42 all contained 0.5 wt. % ADM+0.5% glycine+0.5% amino butyric acid, 5mM BTA+1% $SiO_2$ particles. Example 38 contained 0.125% $H_2O_2$. Example 39 contained 0.35% $H_2O_2$. Example 40 contained 0.50% $H_2O_2$. Example 41 contained 0.75% $H_2O_2$. Example 42 contained 1.0% $H_2O_2$. The remaining percentages of each of the slurry compositions, which were not specified above, represent the percentage of deionized water. The weight percentage of $H_2O_2$ and the disk polishng rates for the copper disk of Examples 38-42 are presented in Table 9.

TABLE 9

| Example | Slurry Composition | % wt. $H_2O_2$ | Polish Rate (nm/min) |
|---|---|---|---|
| 38 | 0.5 wt. % ADM + 0.5% glycine + 0.5% amino butyric acid, 5 mM BTA + 1% $SiO_2$ | 0.125% | 478 |
| 39 | 0.5 wt. % ADM + 0.5% glycine + 0.5% amino butyric acid, 5 mM BTA + 1% $SiO_2$ | 0.35% | 1244 |
| 40 | 0.5 wt. % ADM + 0.5% glycine + 0.5% amino butyric acid, 5 mM BTA + 1% $SiO_2$ | 0.50% | 1177 |
| 41 | 0.5 wt. % ADM + 0.5% glycine + 0.5% amino butyric acid, 5 mM BTA + 1% $SiO_2$ | 0.75% | 862 |
| 42 | 0.5 wt. % ADM + 0.5% glycine + 0.5% amino butyric acid, 5 mM BTA + 1% $SiO_2$ | 1.0% | 504 |

EXAMPLE 43

The slurry of Example 43 was used to polish an 8 inch silicon wafer having a copper layer deposited thereon by electroplating. The CMP polisher was a Westech 372 Wafer Polisher with an IC-1400, k-groove polishing pad. The rotation rate of the carrier was 75 revolutions per minute (rpm). The rotation rate of the platen was also 75 revolutions per minute (rpm). The pressure (i.e., down-force) placed between the copper and the polishing pad was 2 pounds per square inch (psi). The slurry flow rate was 200 ml/min. The amount of copper removed from the surface of the wafer by CMP was determined by measuring the thickness of the copper layer on the wafer both before and after polishing and taking into consideration the polishing time. This was then converted into the rate of removal in terms of nm of copper removed per minute.

Examples 43 contained 0.5 wt. % ADM+0.5% glycine+0.5% amino butyric acid, 5mM BTA+1% $SiO_2$ particles+0.125% $H_2O_2$. The remaining percentage of the slurry composition, which are not specified above, represent the percentage of deionized water. The copper film polishing rate for Example 43 was 1130 nm/min.

Another embodiment of an aqueous slurry may comprise other molybdic acids dissolved in deionized water and an oxidizing agent. Such other molybdic acids may include, but are not limited to, phosphomolybdic acid (PMA), phosphotungstomolybdic acid and vanadiomolybdic acid, for example, and are readily commercially available.

The molybdic acid may be present in an amount of about 0.1 to about 10 wt. %, and more preferably in an amount of about 0.5 to about 10 wt. %. The molybdic acid may be provided in powder form such that the molybdic acid dissolves in the solution of deionized water and an oxidizing agent. Generally speaking molybdic acids are completely visibly dissolved in an aqueous solution of deionized water and the oxidizing agent.

The oxidizing agent used with the molybdic acid may comprise any one or a mixture of the oxidizing agents already described and present in the amounts described earlier. Additionally, complexing agents may be used in the molybdic acid aqueous slurry. Complexing agents may comprise any of the complexing agents and provided in the amounts already described herein.

The oxidizing agents may oxidize the copper as well as react with molybdate ions present in the slurry. The new per-molybdate or peroxy-molybdate ions are expected to further oxidize and complex with copper, thereby providing high polish rates. Similar high polishing action may also occur by use of tungstates, vanadates, chromates and similar transition metal oxide ions or peroxy ions with or without the molybdate ions.

Embodiments of slurries containing the molybdic acid may also be provided with a nonionic surfactant, an anionic surfactant, or a cationic surfactant. The anionic surfactant used in the aqueous slurry may comprise any one or a mixture of the anionic surfactants described herein and provided in the amounts previously described. Similarly, the cationic surfactant used in the aqueous slurry may comprise any one or a mixture of the cationic surfactants and present in the amounts already described. The nonionic surfactant may be one or a mixture of one of the family of polyethylene glycols already described.

Optionally, the aqueous slurry comprising the molybdic acid may also be provided with a copper corrosion inhibitor which may comprise any one or a mixture of heterocyclic organic compounds including benzotriazole (BTA), benzimidazole, poly triazole, phenyl triazole, thion and their derivatives. Further, the slurry may contain any combination of these surfactants and corrosion inhibitors.

A preferred anionic surfactant used in the molybdic acid slurry is a salt of dodecyl benzene sulfonic acid. Dodecyl benzene sulfonic acid surfactant and salts thereof (DBSA) may be present in amounts ranging from about 0.00001 to about 1 wt. % (DBSA), such as about 0.0001 to about 0.5 wt. % (DBSA), and more preferably in an amount of about 0.001 wt. % (DBSA).

A preferred copper corrosion inhibitor used in the slurry comprising the molybdic acid is benzotriazole (BTA). Benzotriazole (BTA) copper corrosion inhibitor may be present in concentrations ranging from about 1 to about 20 milli-molar (mM) BTA, such as about 1 to about 10 mM BTA, and more preferably in a concentration of about 10 mM BTA.

The pH of embodiments of slurries comprising the molybdic acid according to the present invention may be in the range of about 1 to about 14, such as a pH in the range of about 1 to about 6, and preferably having a pH in the of about 4 to about 6. The pH of embodiments of slurries according to the present invention may be adjusted by the addition of suitable acids (e.g., acetic acid) or bases (e.g., potassium or ammonium hydroxide), as would be known by persons having ordinary skill in the art.

Yet additional embodiments of polishing slurries comprising the molybdic acid according to the invention may also be provided with supplemental ceramic/metal oxide particles. Such supplemental ceramic/metal oxide particles may be added to the aqueous slurry as colloidal particles or as fumed particles. Such supplemental ceramic/metal oxide particles used in the aqueous slurry may comprise any one or a mixture of silica, ceria, zirconia, titania, magnesia, iron oxide, tin oxide, and germania. A preferred supplemental ceramic/metal oxide used in the slurry is colloidal silicon dioxide ($SiO_2$). Colloidal silicon dioxide ($SiO_2$) may have an average particle size of between about 10 nm and about 100 nm, and preferably of about 20 nm to about 50 nm.

Polishing slurries comprising the molybdic acid may be utilized in a method for polishing copper by chemical-mechanical planarization. The method comprises providing an aqueous slurry comprising molybdic acid dissolved in deionized water and an oxidizing agent and polishing copper with the aqueous slurry using a polishing pad and a pressure between the copper and the polishing pad of between about 0.5 psi and about 6.0 psi and more preferably between about 0.5 psi and about 2.0 psi.

EXAMPLES 44-49

Slurries of examples 44-49 were used to polish a copper disk having a diameter of 6 inches. The CMP polisher was a Struers DAP® with an IC-1400, k-groove polishing pad. The carrier remained stationary (i.e., was not rotated). The rotation rate of the platen was 90 revolutions per minute (rpm). The pressure placed between the copper and the polishing pad was about 5 pounds per square inch (psi). The slurry flow rate was 60 ml/min. The amount of copper removed from the surface of the disk by CMP was determined by measuring the weight difference of the copper disk both before and after polishing, taking into consideration the density of the Cu material, the area of the disk that was polished, and the polishing time. This was then converted into the rate of removal in terms of nm of copper removed per minute.

The slurries of Examples 44-49 are all the same except that the weight percentage of the oxidizing agent, i.e. hydrogen peroxide ($H_2O_2$), was varied for each Example. Examples 44-49 all contained 1 wt. % phosphomolybdic acid (PMA)+ 10 mM BTA+1% glycine, 1% amino butyric acid+1% $SiO_2$ particles. Example 44 contained 0% $H_2O_2$. Example 45 contained 0.25% $H_2O_2$. Example 46 contained 0.50% $H_2O_2$. Example 47 contained 0.75% $H_2O_2$. Example 48 contained 1.0% $H_2O_2$. Example 49 contained 2.0% $H_2O_2$. The remaining percentages of each of the slurry compositions, which were not specified above, represent the percentage of deionized water. The weight percentage of $H_2O_2$ and the disk polishing rates for the copper disk of Examples 44-49 are presented in Table 10.

TABLE 10

| Example | Slurry Composition | % wt. $H_2O_2$ | Polish Rate (nm/min) |
|---|---|---|---|
| 44 | 10 wt. % PMA + 1 mM BTA + 1% glycine + 1% amino butyric acid + 1% $SiO_2$ | 0% | 698 |
| 45 | 10 wt. % PMA + 1 mM BTA + 1% glycine + 1% amino butyric acid + 1% $SiO_2$ | 0.25% | 1670 |
| 46 | 10 wt. % PMA + 1 mM BTA + 1% glycine + 1% amino butyric acid + 1% $SiO_2$ | 0.50% | 4424 |
| 47 | 10 wt. % PMA + 1 mM BTA + 1% glycine + 1% amino butyric acid + 1% $SiO_2$ | 0.75% | 9233 |
| 48 | 10 wt. % PMA + 1 mM BTA + 1% glycine + 1% amino butyric acid + 1% $SiO_2$ | 1.00% | 13978 |
| 49 | 10 wt. % PMA + 1 mM BTA + 1% glycine + 1% amino butyric acid + 1% $SiO_2$. | 2.00% | 11087 |

Yet another embodiment of an aqueous slurry may comprise molybdenum trioxide ($MoO_3$) dissolved in deionized water and an oxidizing agent. To this mixture is added supplemental ceramic/metal oxide particles as already described herein, but which may be added as colloidal particles or as fumed particles. As previously described above with regard to the molybdenum trioxide ($MoO_3$) slurry, the same oxidizing agents, complexing agents, surfactants, corrosion inhibitors, acids, and bases may be used in various combinations in accordance with the teachings provided herein.

The $MoO_3$ may be utilized in a method for polishing copper by chemical-mechanical planarization. The method comprises providing an aqueous slurry comprising dissolved $MoO_3$ and an oxidizing agent and polishing copper with the aqueous slurry using a polishing pad and a pressure between the copper and the pad of between about 0.5 psi and about 6.0 psi, and more preferably between about 0.5 psi and about 2.0 psi.

Embodiments of $MoO_3$ slurries according to the present invention exhibit high polish rates for copper when used in the CMP process, even when the CMP process is carried out at very low pressures. More particularly, when molybdenum trioxide $MoO_3$ particles were dispersed and completely dissolved in an aqueous solution containing deionized water, hydrogen peroxide, and BTA and used as a copper CMP slurry, high disk polish rates (e.g., about 1200 nm/minute) were obtained with a nominal pressure (e.g., about 0.5 to about 2.0 psi). As mentioned, CMP processes carried out at high pressures may cause undesirable delamination of lower-k dielectric layers provided on the copper. Accordingly, copper CMP should be carried out at low pressures, such as, for example, pressures in a range of about 0.5-6.0 psi, and more preferably pressures as low as 0.5-2.0 psi, to minimize the shear forces that act on the low-k layers of dielectric materials during the CMP process. Thus, the slurries described herein may be used to advantage in copper CMP processes described herein, allowing the processes to be carried out at high throughput rates while minimizing defects such as micro-scratches, corrosion, dishing, erosion, as well as enabling high cleanability of the polished surface that has been exposed to a variety of chemicals and particles.

The high disk polish rates obtained from CMP processes described herein carried out at such minimal pressures (e.g., in a range of about 0.5 to about 2.0 psi) indicates the active chemical nature of the slurry. One of the reasons why this slurry exhibits such a high chemical reactivity is due to the complete dissolution of the molybdenum trioxide particles. With proper choice of the concentrations of the additives and by inclusion of a corrosion inhibitor and an abrasive, polish rates can be tuned according to a user's requirements and delamination of the low-k dielectric layers can be minimized.

As shown in Example 54, blanket copper wafer polishing rates of one embodiment of an $MoO_3$ slurry of the present invention were determined to be as high as about 1200 nm/minute. The slurries of Examples 50-54 were filtered to remove any undissolved particles above 1,000 nm (1 micron) in size and 1.0 wt % of 20 nm colloidal $SiO_2$ abrasives were added.

The post-polish surface of the copper was good with post CMP surface roughness values of about 1 nm as measured by a non-contact optical profilometer. If higher post-polish surface quality is desired, the CMP polishing step may be followed by a buffing step. In one embodiment, the buffing step may involve additionally polishing the copper surface with deionized water for about five to about fifteen seconds at a pH in the range of about 5 to about 7. The advantage of using a deionized water rinse buffing step is the removal of reactive chemicals from the wafer-pad interface, which removes residual amounts of molybdenum oxide that may remain on the surface of the wafer-pad. Clean and smooth copper surfaces may be obtained after subsequent buffing using a deionized water rinse.

The general methodology for pattern wafer copper polishing is to polish the bulk copper initially at a high polish rate and then, as planarization is achieved, the copper polish rate is reduced in order to minimize dishing of copper lines. With proper adjustment of the slurry constituent composition and process parameters, the slurry of the present invention can be tuned for this general methodology of polishing at higher rates and then lower rates.

EXAMPLES 50-54

Slurries of examples 50-54 were used to polish copper deposited on a silicon wafer disk having a diameter of 6 inches. The copper was deposited by electroplating. The CMP polisher was a Westech Model 372 with an IC-1400, k-groove polishing pad. The carrier was rotated at a rate of 75 rpm. The pressure placed on the copper disk was 4 pounds per square inch (psi). The slurry flow rate was 200 ml/min. The amount of copper removed from the surface of the disk by CMP was determined by measuring the thickness of the copper film both before and after polishing, taking into consideration the polishing time. This was then converted into the rate of removal in terms of nm of copper layer removed per minute.

The slurries of Examples 50-54 are all the same except that the weight percentage of molybdenum trioxide was varied for each example. Examples 50-54 all contained 5% $H_2O_2$+0.5% glycine+10 mM BTA—filtered+1% SiO2 particles. Example 50 contained 0 wt. % $MoO_3$. Example 51 contained 0.5 wt. % $MoO_3$. Example 52 contained 1.0 wt. % $MoO_3$. Example 53 contained 3.0 wt. % $MoO_3$. Example 54 contained 5.0 wt. % $MoO_3$. The remaining percentages not specified above represent the percentage of deionized water. The weight % of molybdenum and polishing rates for the copper disks of Examples 50-54 are presented in Table 11.

TABLE 11

| Example | Slurry Composition | % wt. $MoO_3$ | Polish Rate (nm/min) |
|---|---|---|---|
| 50 | 5.0% $H_2O_2$ + 0.5% glycine + 10 mM BTA + filtered + 1% $SiO_2$ | 0% | 350 |
| 51 | 5.0% $H_2O_2$ + 0.5% glycine + 10 mM BTA + filtered + 1% $SiO_2$ | 0.5% | 900 |
| 52 | 5.0% $H_2O_2$ + 0.5% glycine + 10 mM BTA + filtered + 1% $SiO_2$ | 1.0% | 900 |
| 53 | 5.0% $H_2O_2$ + 0.5% glycine + 10 mM BTA + filtered + 1% $SiO_2$ | 3.0% | 1000 |
| 54 | 5.0% $H_2O_2$ + 0.5% glycine + 10 mM BTA + filtered + 1% $SiO_2$ | 5.0% | 1200 |

EXAMPLES 55-58

Slurries of examples 55-58 were used to polish a copper film deposited on a silicon substrate wafer having a diameter of 6 inches. The copper film was deposited by electroplating. The CMP polisher was a Westech Model 372 with an IC-1400, k-groove polishing pad. The carrier was rotated at a rate of 75 rpm. The platen was rotated at 75 rpm. The pressure (i.e., down-force) between the copper and the polishing pad was about 4 pounds per square inch (psi). The slurry flow rate was set at 200 ml/min. The amount of copper removed from the surface of the disk by CMP was determined by measuring the thickness of the copper film both before and after polishing, taking into consideration the polishing time. This was then converted into the rate of removal in terms of nm of copper removed per minute.

The slurries of Examples 55-58 are all the same except that the type of abrasive was varied for each Example. Examples 55-58 all contained 0.5 wt. % $MoO_3$+5.0% $H_2O_2$+1.0 % glycine+10 mM BTA. Example 55 contained no abrasives. Example 56 contained colloidal alumina ($AlO_2$) particles, having a mean particle size of 50 nm, as an abrasive. Example 57 contained Aerosol® 200 fumed silica particles as an abrasive. Example 58 contained colloidal silica ($SiO_2$) particles, having a mean particle size of 20 nm, as an abrasive. The remaining percentages not specified above represent the percentage of deionized water. The effect of the various types of abrasives on the polish rate of a slurry containing 0.5 wt. % molybdenum trioxide is shown in Table 12.

TABLE 12

| Example | Slurry Composition | Abrasive (1% wt.) | Polish Rate (nm/min) |
|---|---|---|---|
| 55 | 0.5% $MoO_3$ + 5.0% $H_2O_2$ + 10 mM BTA | No Abrasive | 360 |
| 56 | 0.5% $MoO_3$ + 5.0% $H_2O_2$ + 10 mM BTA | 50 nM colloidal alumina ($AlO_2$) | 495 |
| 57 | 0.5% $MoO_3$ + 5.0% $H_2O_2$ + 10 mM BTA | Aerosil ® 200 fumed silica ($SiO_2$) | 495 |
| 58 | 0.5% $MoO_3$ + 5.0% $H_2O_2$ + 10 mM BTA | 20 nm colloidal silica ($SiO_2$) | 740 |

Yet another embodiment of an aqueous slurry may comprise molybdenum dioxide ($MoO_2$) dissolved in deionized water, an oxidizing agent, as previously described above. To this mixture is added supplemental ceramic/metal oxide particles as already described herein, but which may be added as colloidal particles or as fumed particles. As previously described above with regard to the molybdenum dioxide ($MoO_2$) slurry, the same oxidizing agents, complexing agents, surfactants, corrosion inhibitors, acids, and bases may be used in various combinations in accordance with the teachings provided herein.

The $MoO_2$ may be utilized in a method for polishing copper by chemical-mechanical planarization. The method comprises providing an aqueous slurry comprising dissolved $MoO_2$ and an oxidizing agent and polishing copper with the aqueous slurry using a polishing pad and a pressure (i.e., down-force) of between about 0.5 psi and about 6.0 psi, and more preferably between about 0.5 psi and about 2.0 psi.

EXAMPLES 59-62

Slurries of examples 59-62 were used to polish a copper coated silicon wafer having a diameter of 6 inches. The copper was coated on the wafer by electroplating. The CMP polisher was a Westech Model 372 with an IC-1400, k-groove polishing pad. The carrier was rotated at a rate of 75 rpm. The pressure placed on the copper disk was 4 pounds per square inch (psi). The slurry flow rate was 200 ml/min. The amount of copper removed from the surface of the disk by CMP was determined by measuring the thickness of the copper film both before and after polishing, taking into consideration the polishing time. This was then converted into the rate of removal in terms of nm of copper removed per minute.

The slurries of Examples 59-62 show the effect of different abrasives on the polish rates of copper disks. The pH of Examples 59-62 was maintained at approximately 4. Example 59 contained 3 wt % $KIO_3$. Example 60 contained filtrate from a solution comprising 3 wt % $MoO_2$+3 wt % $KIO_3$. Example 61 contained filtrate from a solution comprising 3 wt % $MoO_2$+3 wt % $KIO_3$+3 wt % silica. Example 62 contained filtrate from a solution comprising 3 wt % $MoO_2$+3 wt % $KIO_3$+3 wt % alumina. The remaining percentages of the slurry composition which were not specified represent the percentage of deionized water. The weight percentage and type of abrasives and the disk polishing rates for the copper disks of Examples 59-62 are presented in Table 13.

TABLE 13

| Example | Slurry Composition | Abrasive | Polish Rate (nm/min) |
|---|---|---|---|
| 59 | 3% $KIO_3$ | none | 30 ± 3 |
| 60 | 3% $MoO_2$ + 3% $KIO_3$ | none | 268 ± 10 |
| 61 | 3% $MoO_2$ + 3% $KIO_3$ | 3% wt. silica ($SiO_2$) | 353 ± 15 |
| 62 | 3% $MoO_2$ + 3% $KIO_3$ | 3% wt. alumina ($AlO_2$) | 840 ± 17 |

In conclusion, the claimed product and process collectively represent an important development in CMP technology. The product and process discussed above are novel, distinctive, and highly beneficial from a technical and utilitarian standpoint. Having herein set forth preferred embodiments of the present invention, it is anticipated that suitable modifications can be made thereto which will nonetheless remain within the scope of the invention. The invention shall therefore only be construed in accordance with the following claims:

The invention claimed is:

1. An aqueous slurry for chemical mechanical planarization of a copper layer on a semiconductor substrate, comprising particles of a soluble salt of molybdenum visibly dissolved in a solution of deionized water and an oxidizing agent, said soluble salt of molybdenum comprising one or more selected from the group consisting of ammonium dimolybdate and ammonium octamolybdate.

2. The aqueous slurry of claim 1, wherein said slurry comprises about 0.1% to about 10% by weight of said soluble salt of molybdenum.

3. The aqueous slurry of claim 1, wherein said oxidizing agent comprises one or more selected from the group consisting of hydrogen peroxide, ferric nitrate, potassium iodate, nitric acid, potassium permanganate, potassium persulfate, ammonium persulfate, potassium periodate, and hydroxylamine.

4. The aqueous slurry of claim 1, further comprising a complexing agent.

5. The aqueous slurry of claim 1, further comprising a nonionic surfactant, an anionic surfactant or a cationic surfactant.

6. The aqueous slurry of claim 1, further comprising a copper corrosion inhibitor.

7. The aqueous slurry of claim 1, wherein the pH of said aqueous slurry is in the range of about 4 to about 6.

8. The aqueous slurry of claim 1, further comprising ceramic/metal oxide particles comprising one or a mixture of silica, ceria, zirconia, titania, magnesia, iron oxide, tin oxide, and germania.

9. The aqueous slurry of claim 8, wherein the ceramic/metal oxide particles include colloidal particles.

10. The aqueous slurry of claim 9, wherein the colloidal particles include colloidal silicon dioxide particles.

11. The aqueous slurry of claim 10, wherein the colloidal silicon dioxide particles have an average particle size of between about 10 nm and about 100 nm.

12. The aqueous slurry of claim 8, wherein the ceramic/metal oxide particles include fumed particles.

* * * * *

UNITED STATES PATENT AND TRADEMARK OFFICE
CERTIFICATE OF CORRECTION

PATENT NO.         : 7,553,430 B2                                    Page 1 of 1
APPLICATION NO.    : 11/540297
DATED              : June 30, 2009
INVENTOR(S)        : Sunil Chandra Jha et al.

It is certified that error appears in the above-identified patent and that said Letters Patent is hereby corrected as shown below:

On the cover page item:

(12) Header, Line (2): Delete "Chandra" and insert --Jha--.

(75) Inventors, Line (5): After Chandra, insert --Jha--.

Signed and Sealed this

Eleventh Day of August, 2009

David J. Kappos
*Director of the United States Patent and Trademark Office*